United States Patent [19]

Hulina

[11] Patent Number: 5,521,512
[45] Date of Patent: May 28, 1996

[54] TIME DOMAIN REFLECTOMETER USING SUCCESSIVELY DELAYED TEST PULSES AND AN INTERLEAVED SAMPLING PROCEDURE

[75] Inventor: Paul T. Hulina, State College, Pa.

[73] Assignee: The Penn State Research Foundation, University Park, Pa.

[21] Appl. No.: 379,087

[22] Filed: Jan. 26, 1995

Related U.S. Application Data

[63] Continuation of Ser. No. 108,011, Aug. 16, 1993, abandoned.

[51] Int. Cl.⁶ ..................................................... G01R 31/11
[52] U.S. Cl. ........................ 324/533; 324/534; 324/76.38; 324/644
[58] Field of Search ................................ 324/76.38, 533, 324/534, 642, 644

[56] References Cited

U.S. PATENT DOCUMENTS

| | | |
|---|---|---|
| 3,244,975 | 4/1966 | Bauer . |
| 3,434,049 | 3/1969 | Frye . |
| 3,612,782 | 10/1971 | Gilbert . |
| 3,621,325 | 11/1971 | Moffitt .............................. 324/121 R |
| 4,041,381 | 8/1977 | Hwa . |
| 4,104,582 | 8/1978 | Lambertsen . |
| 4,168,467 | 9/1979 | Bailey ...................................... 368/119 |
| 4,265,122 | 5/1981 | Cook et al. . |
| 4,475,079 | 10/1984 | Gale . |
| 4,694,244 | 9/1987 | Whiteside ........................... 324/121 R |
| 4,703,433 | 10/1987 | Sharrit . |
| 4,739,276 | 4/1988 | Graube . |
| 4,766,549 | 8/1988 | Schweitzer, III et al. . |
| 4,797,621 | 1/1989 | Anderson et al. . |
| 4,859,951 | 8/1989 | Cole et al. . |
| 4,875,772 | 10/1989 | Gentile . |
| 4,887,041 | 12/1989 | Mashikian et al. . |
| 4,914,394 | 4/1990 | Meyer . |
| 4,970,466 | 11/1990 | Bolles et al. . |
| 5,382,910 | 1/1995 | Walsh ...................................... 324/533 |

OTHER PUBLICATIONS

Oliver: "Electronic Measurements and Instrumentation". 1972—McGraw Hill—pp. 398–407.

*Primary Examiner*—Kenneth A. Wieder
*Assistant Examiner*—Jose M. Solis
*Attorney, Agent, or Firm*—Thomas J. Monahan

[57] ABSTRACT

A time domain reflectometer includes a clock signal source that synchronizes a Start pulse source which, in turn, generates a succession of Start pulses. Each succeeding Start pulse, after an initial Start pulse, is delayed in time from a preceding Start pulse by a test pulse interval plus a delay time. A test pulse circuit responds to each Start pulse by applying a test pulse to the LUT. A reflection signal sampling circuit samples N reflection signals in synchronism with the clock signal source, whereby successive ones of the N reflection signals are sampled at different delay times as a result of the delay time added to each succeeding Start pulse. A memory circuit assembles sampled reflection signal values from the N reflection signals in a manner that the reflection signal values are interleaved in time order as though all sampled reflection signal values were obtained from a single reflection signal.

14 Claims, 3 Drawing Sheets

TIME DOMAIN REFLECTOMETER USING SUCCESSIVELY DELAYED TEST PULSES AND AN INTERLEAVED SAMPLING PROCEDURE

This is a continuation of application Ser. No. 08/108,011 filed on Aug. 16, 1993, now abandoned.

FIELD OF THE INVENTION

This invention relates to time domain reflectometry, and more particularly, to a time domain reflectometer that employs successively delayed test pulses and interleaves sampled reflections to achieve a high effective sample rate.

BACKGROUND OF THE INVENTION

Time domain reflectometry repeatedly transmits short duration pulses along a cable or line under test (LUT) and examines reflected waveshapes to determine the condition of the LUT. Classically, reflected signals have been observed as a trace on an oscilloscope, requiring a user to make a spot judgement regarding the severity of a potential problem on the LUT.

Modern time domain reflectometers digitally sample a reflected signal waveform, store the sampled digital values, and subsequently analyze the signal's waveshape. To achieve an optimum reproduction of the reflected waveform, a high frequency sample rate is required; however, as the sample frequency rate increases, more sophisticated (and expensive) systems are required to digitize and store these high frequency signals.

To enable the use of lower frequency sample rates while still achieving accurate reflected waveform reproduction, prior art circuits generate many test pulses and sample each succeeding reflection waveform at an increasingly later time in the reflected pulse. By combining all of the sample waveform values over many succeeding test pulses, an accurate waveshape is achieved that is equivalent to one achieved as a result of an extremely high sample rate. Such systems are taught in U.S. Pat. No. 3,244,975 to Bauer and U.S. Pat. No. 4,797,621 to Anderson et al. While achieving highly accurate waveshapes, such systems require successive sampling of many reflected pulse waveforms to achieve an effective high frequency sampling rate. The prior art circuits thus require a substantial time period to process sequential reflection waveforms so as to obtain the desired waveshape. If, during such time period, the condition changes that causes the reflections on the LUT, the resulting signal waveform may be distorted and difficult to analyze.

Accordingly, it is an object of this invention to provide a time domain reflectometry system wherein test signal return synthesis can be accomplished in a short time period.

It is another object of this invention to provide a time domain reflectometry system that manifests a high frequency sample rate and achieves an effective reflected pulse waveform after a few test pulses.

It is still another object of this invention to provide a time domain reflectometry system which employs low frequency data processing circuitry.

SUMMARY OF THE INVENTION

A time domain reflectometer includes a clock signal source that synchronizes a Start pulse source which, in turn, generates a succession of Start pulses. Each succeeding Start pulse, after an initial Start pulse, is delayed in time from a preceding Start pulse by a test pulse interval plus a delay time. A test pulse circuit responds to each Start pulse by applying a test pulse to the LUT. A reflection signal sampling circuit samples N reflection signals in synchronism with the clock signal source, whereby successive ones of the N reflection signals are sampled at different times as a result of the delay time added to each succeeding Start pulse. A memory circuit assembles sampled reflection signal values from the N reflection signals in a manner that the reflection signal values are interleaved in time order as though all sampled reflection signal values were obtained from a single reflection signal.

DETAILED DESCRIPTION OF THE INVENTION

Figure 1:
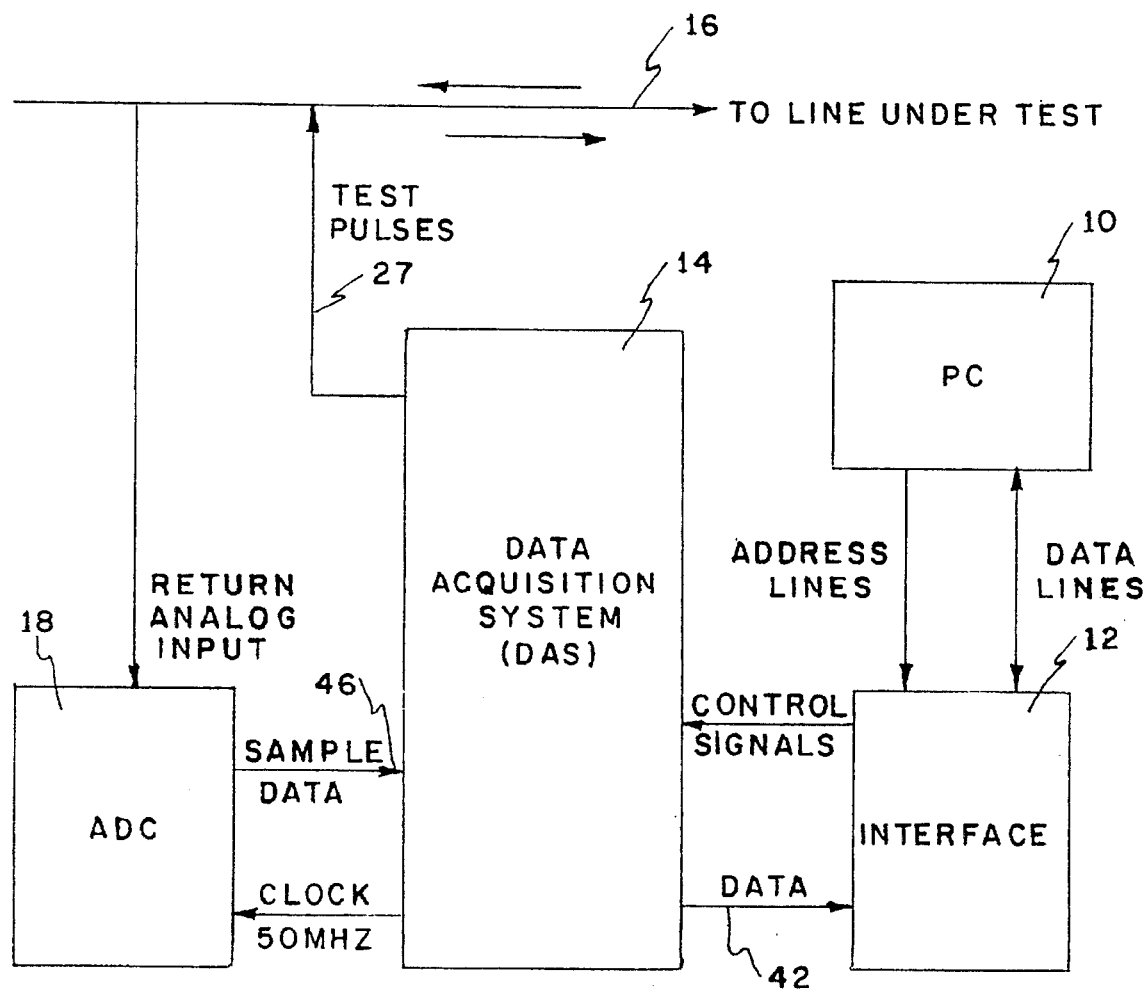
FIG. 1 is a high level block diagram of a circuit that incorporates the invention.

A time domain reflectometer that incorporates the invention is shown in FIG. 1 and comprises a personal computer (PC) 10 which operates through an interface 12 to control a data acquisition system (DAS) 14. Test pulses are repetitively generated by DAS 14 and are applied, via lines 27 and 16, to a connected line under test (LUT). Reflected signals (analog) are received via line 16 and applied through a gated, analog-to-digital converter (ADC) 18 wherein the analog values are converted to digital values at a clocked sampling rate, and are then fed to DAS 14. In the subsequent discussion, it will be assumed that 8 bit digital samples are provided by ADC 18 to DAS 14 and that an exemplary clock frequency of 50 Mhz is employed as the gating frequency for ADC 18. It is to be understood however, that these values are merely exemplary and that other clock frequencies and sampled digital data sizes can be employed. The system of FIG. 1 operates on the basis of delaying a test pulse input to line 16, repeatedly, by applying test pulses at 0, ⅛, ¼, ⅜, ½, ⅝, ¾, and ⅞ths of a sampling period. In other words, with reference to a fixed time base (e.g. the clock signal), a first test pulse is generated at the inception of a first sampling period, a second test pulse is generated during a second, later, sampling period, the second test pulse commencing after a delay of ⅛th of the sampling period; third pulse is generated during a third, later, sampling period, starting after a delay of ¼ of the third sampling period, etc. Thus, a series of test pulses are generated, with each one being successively delayed from the beginning of a sampling period by an amount that increases at a rate of ⅛ of a sampling period, per sampling period.

As will be understood from the following discussion, a reflected signal from a LUT is sampled at a set clock rate. As delays between successive test pulses that create the reflected signals are sequentially increased, each reflected signal is offset by ⅛th of a sampling period. Thus, over a series of reflected signals, incrementally delayed portions of a reflection signal are sampled, digitized and stored. Subsequently, the stored values are interleaved in time order as though all reflection signal sample values were obtained from a single reflection signal. As a result, an effective sampling rate is achieved that is a multiple of the actual sampling rate.

Figure 2:
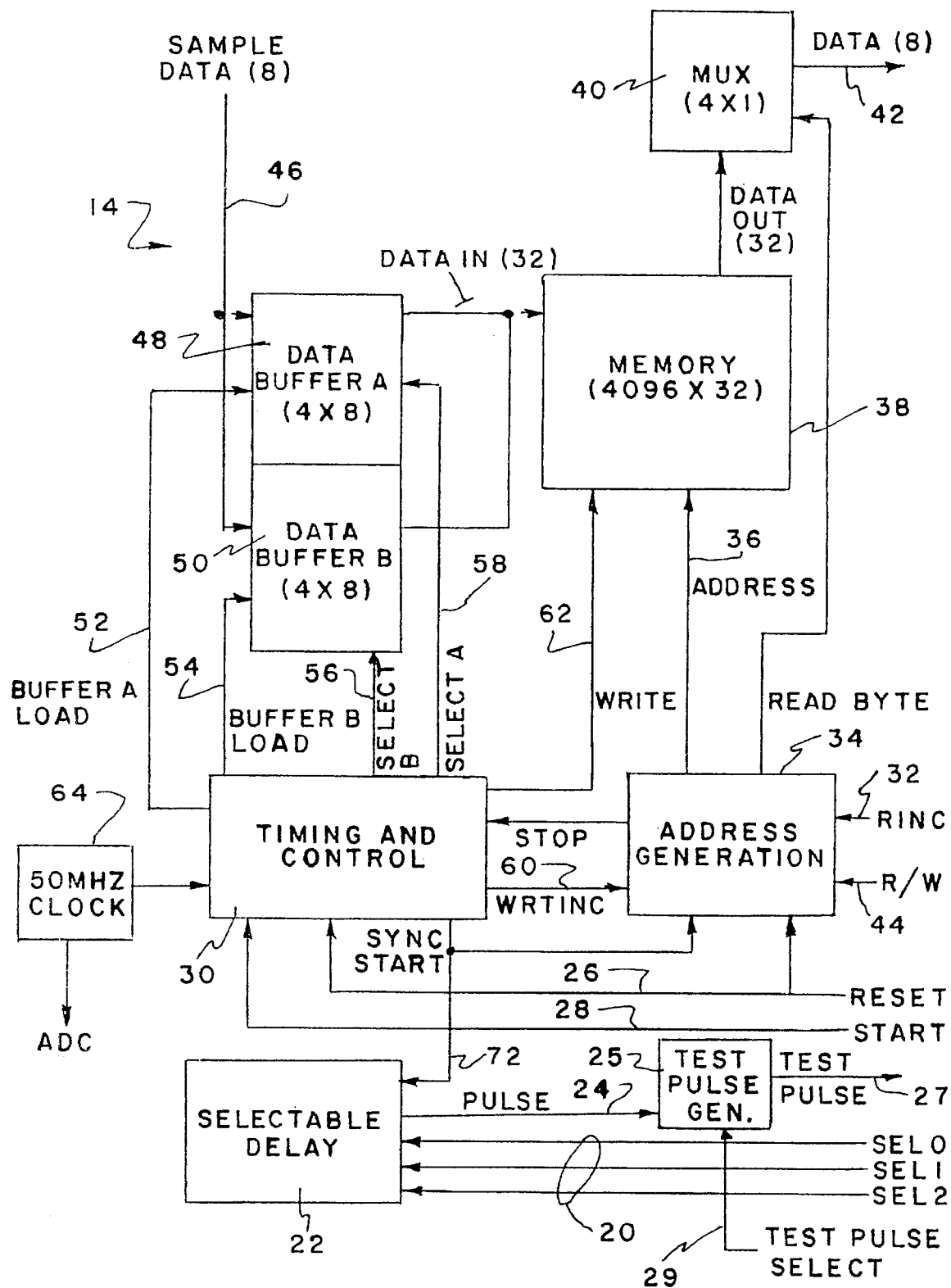
FIG. 2 is a more detailed block diagram of the data acquisition system shown in FIG. 1.

FIG. 2 is a detailed block diagram of components that comprise a preferred embodiment of DAS 14. Control signals for the operation of DAS 14 are generated by PC 10 and are applied by interface 12 to a plurality of input command lines (shown generally at the lower right of FIG. 2). Lines 20 apply 3 bit states (SEL 0, SEL 1, SEL 2) to selectable delay module 22. Those bit states cause a selection of one of eight states (7 are delay states) within selectable delay module 22 and enable an output of a pulse on line 24 to a test pulse generator 25. A test pulse is then produced by test pulse generator 25 and is applied via output line 27 and line 16 to a LUT.

Selectable delay module 22 is preferably a digitally programmable delay generator such as an AD9501 manufactured by Analog Devices Inc., 1 Technology Way, P.O. Box 9106, Norwood, Mass. 02062. The AD9501 is programmable to provide multiples of 2.5 nanosecond time delays of an input pulse. While such a device is capable of providing one of 256 unique delays, in the present invention only seven delayed signals are required and thus only three command input lines 20 are utilized.

Reset and Start lines 26 and 28 provide control levels to a timing and control module 30. Reset line 26 resets a memory address counter within timing control module 30 and Start line 28 (when active) causes DAS 14 to commence the capture of a plurality of digital sample values from analog reflection signals. RINC (read increment) line 32 is applied to address generation module 34 to enable the generation of a series of addresses via line 36 to a 4 k by 32 word memory 38. The RINC value applied via line 32 selects an increment of addressing and controls which data samples in memory 38 are read out to a multiplexed 40 and thence to PC 10 (via data line 42). R/W line 44 is applied to address generation module 34 and controls the read/write status thereof.

Sampled 8-bit digital values from ADC 18 are applied via line 46 to a pair of 4×8 data buffers 48 and 50. Sequential values are loaded, alternately, into data buffers 48 and 50 so that a first entry (comprising four sampled values) can be read from one data buffer into memory 38 while a second entry of four sampled values is being loaded into the other data buffer. The read in and read out states of data buffers 48 and 50 are controlled by levels on lines 52, 54, 56, and 58.

Timing and control module 30 controls the operation of address generation module 34 by providing write increment values via line 60 that control where digital values read from buffers 48 and 50 are placed within memory 38. A write control line 62 controls write operations in memory 38.

Overall timing and operation of the system of FIG. 1 is controlled by a 50 MHz clock 64 whose output is fed to timing and control module 30 and to ADC 18. Clock signals gate ADC 18 to output sequential digital values representative of analog values of a reflection signal. As aforesaid, since each of a sequence of test pulses applied to line 16 is incrementally delayed, the clock input to ADC 18 will cause the sampling of an increasingly delayed segments of the reflected analog signal.

Figure 3:
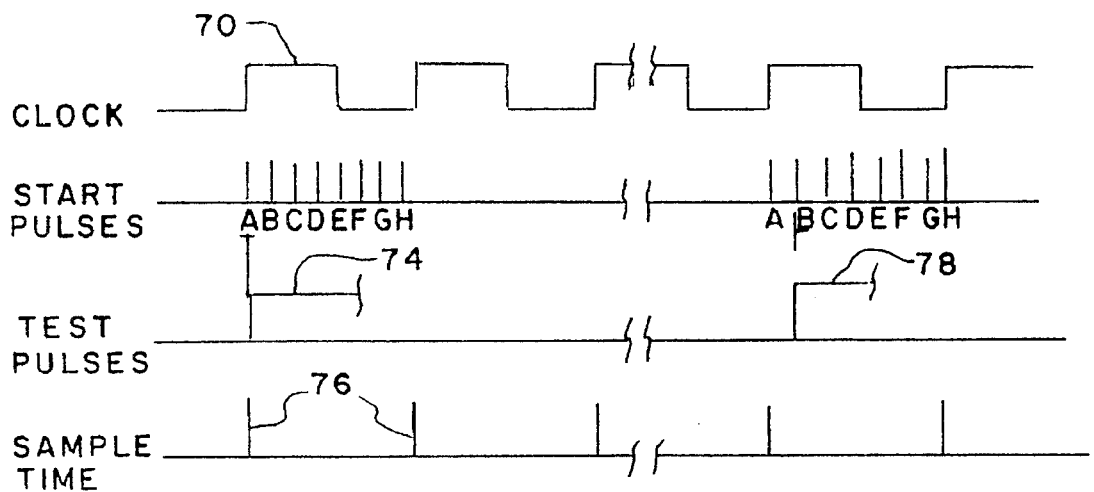
FIG. 3 is a set of waveform diagrams helpful in understanding the operation of the circuits of FIGS. 1 and 2.

Turning to FIG. 3, the operation of the invention will be described in conjunction with the block diagrams of FIGS. 1 and 2. Waveform 70 illustrates the output of clock circuit 64. Upon a Start signal being applied by PC 10 to line 28 (FIG. 2), the rising edge of a clock signal 70 is applied via sync start line 72 to selectable delay module 22. Selectable delay module 22 has the capability of providing (under control of input lines 20) any one of seven sequentially delayed pulses (and a non-delayed pulse) on pulse output line 24. Thus, as shown in FIG. 3, any of 8 output Start pulses (A–H) may be emplaced on pulse line 24, depending upon the status of input line 20. However, on the first cycle of operation, selectable delay module responds to a sync start signal from timing and control module 36, by producing a non-delayed output pulse A on pulse line 24. Pulse A may be used (as is) as a test pulse or may be employed to trigger test pulse generator 25 which, in turn, applies its output via line 27 to an LUT. The test pulse may be selected, both as to wave shape and duration in accordance with an input on TEST PULSE SELECT line 29 to test pulse generator 27, the input on line 29 may be either user-selected (e.g. by a switch) or be programmably selected by PC 10. An exemplary leading edge of a test pulse is shown at 74 in FIG. 3.

Simultaneously with the generation of the sync start signal, ADC 18 is operated by the rising edges of clock pulses 70 to commence sampling of analog reflection signals from an LUT. Those sample times are illustrated by pulses 76 in FIG. 3. ADC 18, as a result, samples the analog reflection signals at a sampling frequency set by clock signal 70 and provides digital inputs via sample data line 46 to data buffers 48 and 50.

After sufficient time has been allowed for a reflection signal to arrive and be sampled by ADC 18, a next test pulse 78 is generated. This action is commenced by a sync start signal being applied via line 72 to selectable delay 22. However, in this instance, the digital values on lines 20 have been changed by PC 10 to cause selectable delay 22 to delay the output on pulse line 24 by one Start pulse interval. As a result, a delayed Start pulse B is issued on pulse line 24 and causes a test pulse 78 to be applied to line 16 (FIG. 1). Notwithstanding the delayed generation of test pulse 78, sample time pulses 76 remain synchronous with clock signal 70 and immediately cause ADC 18 to commence sampling values of a reflection signal. Because test pulse 78 is offset by one Start pulse in time from test pulse 74, the sampled digital values obtained from the analog reflection signal (resulting from test pulse 78) are offset by one Start pulse interval.

Those skilled in the art will realize that over a period of eight test pulses, eight sets of sampled data are obtained, each set offset from the other by one Start pulse interval. By interleaving (i.e. arranging) the digitally sampled values (e.g. via an eight-way interleave), a reflection signal can be reconstructed so as to evidence a sample rate that is an 8 times multiple of the actual sample rate.

Figure 4:
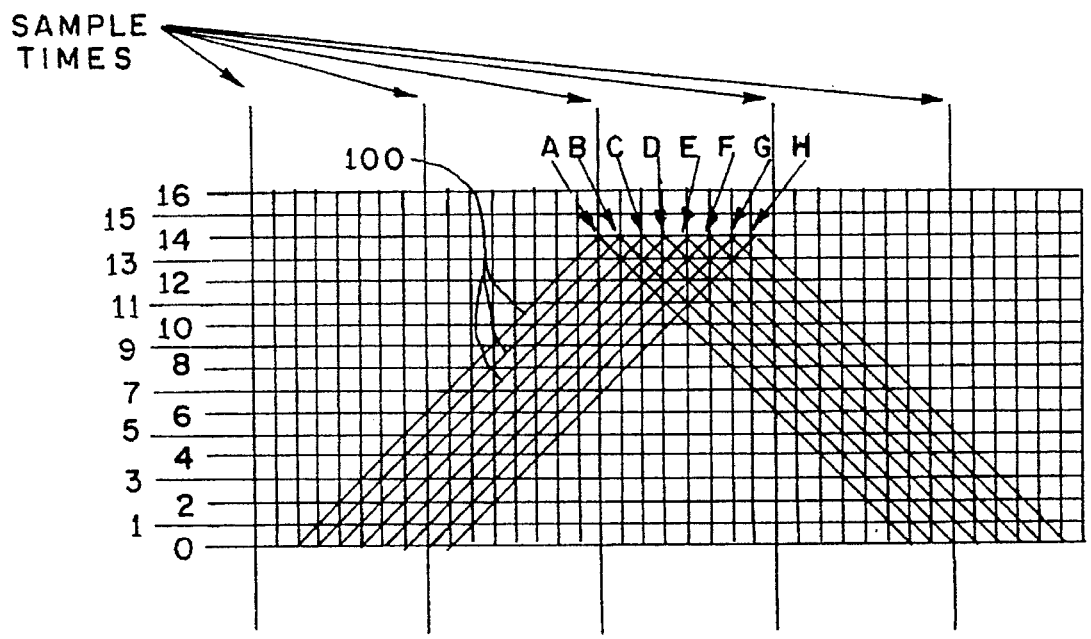
FIG. 4 illustrates, in an overlapped manner, how data from succeeding reflection signals, evidences an effective, high frequency sampling rate.

FIG. 4 is further illustrative of the operation of the invention. Each of waveforms 100 is an analog reflection signal fed to ADC 18. However, the intervening time between sampling periods has been removed so that the reflection signals can be shown in an overlapping manner to illustrate the respective start pulse time delays between each Thus, when an analog reflection signal 100 (derived as a result of Start pulse A) is received at ADC 18, sample time value outputs from ADC 18 are 0, 6, 14, 6, and 0. When a next analog reflection signal 100 (that occurs as a result of Start pulse B) is received, the sampled values are 0, 5, 13, 7 and 0. The sampled values from ADC 18 that result from later analog reflection signals 100 (i.e. from test pulses commenced at times C–H) can be seen in the remainder of the chart of FIG. 4. An interleaving of the resultant sample values then enables a reconstruction of the reflection signal over a test interval encompassing only 8 test pulses—while enabling an effective sample rate that is eight times the actual sample rate (e.g. 400 Mhz vs. 50 Mhz).

Returning to FIG. 2, sample digital data values from ADC 18 are alternately fed to data buffers 48 and 50 and are loaded, under control of timing and control module 30, into memory 38. Those skilled in the art will understand that through appropriate control of the addressing of memory 38, that data supplied to MUX 40 and applied to line 42 can be provided to PC 10 in an interleaved time order as though all sampled digital sample values were obtained from a single reflection signal. More specifically, since it is known in advance where data samples are stored in memory 38, PC 10 is able to increment (via commands on RINC line 32), the address values provided on address line 36 to assure the readout of properly interleaved, digitized reflection values. If the four 8 bit bytes read out from memory 38 require further rearrangement to achieve proper time sequencing, the input to multiplexed 48 can be appropriately controlled to sequence the data on output line 42.

It should be understood that the foregoing description is only illustrative of the invention. Various alternatives and modifications can be devised by those skilled in the art without departing from the invention. Thus, while the invention has been described in the context of an electrical line under test, the invention is equally applicable to fiber optic lines. Accordingly, the present invention is intended to embrace all such alternatives, modifications and variances which fall within the scope of the appended claims.

I claim:

1. A time domain reflectometer for determining impulse characteristics of a line under test (LUT), comprising:

a clock signal source;

start pulse means responsive to said clock signal source for applying a succession of test pulses during a succession of test periods to a line under test (LUT), each succeeding test pulse, after an initial test pulse, delayed in time in relation to a beginning of a test period by a test time increment that increases in each succeeding test period; and reflection signal sample means coupled to said LUT, for sampling N reflection signals to obtain sampled reflection signal values, said reflection signal sample means operating to sample each said reflection signal n times per reflection signal, where n is an integer>1, each sample occurring coherently with signals derived from said clock signal source, whereby each successive one of said N reflection signals is sampled n different positions that are different from sample positions of other of said N reflection signals as a result of said test time increment added to each succeeding test pulse.

2. The time domain reflectometer as recited in claim 1, further comprising:

means for arranging sampled reflection signal values in a manner that each sampled reflection signal value occurs in time order as though all sampled reflection signal values were obtained from a single reflection signal, to thereby represent a waveshape of said reflection signal.

3. The time domain reflectometer as recited in claim 2, wherein said Start pulse means generates N Start pulses, to cause an application of N successively delayed test pulses to said LUT, each said test pulse separated in time from a succeeding test pulse by said set interval plus said delay time, thereby enabling said waveshape of said reflection signal to be derived over said N test pulses.

4. The time domain reflectometer as recited in claim 3 wherein said Start pulse means comprises a programmable delay circuit that is responsive to a command input to provide one of N pulses, each pulse delayed from a succeeding pulse by said delay time.

5. The time domain reflectometer as recited in claim 4 wherein said return signal sample means comprises:

an analog-to-digital converter having a sampling input that is synchronous with a clock signal from said clock signal source, whereby digital signal samples are derived synchronously from succeeding reflection signals.

6. The time domain reflectometer as recited in claim 5 wherein said means for arranging comprises:

plural data buffers feeding a sampled reflection signal memory, at least one of said plural data buffers operated to receive digitized signal samples from said analog-to-digital converter, while another said data buffer provides as inputs to said sampled reflection signal memory, digital signal samples previously loaded thereinto.

7. The time domain reflectometer as recited in claim 6 wherein said means for interleaving further comprises:

address generation means for controlling said plural data buffers to insert said digitized signal samples into determined addresses in said sampled reflection signal memory; and processor means for accessing said determined addresses in an order so as to assure an arrangement of said digitized reflection signal samples as though all thereof were obtained in time sequence from a single sampled reflection signal.

8. The time domain reflectometer as defined in claim 2, further comprising:

means for selecting a test pulse wave shape for application to an LUT.

9. A method for time domain reflectometry comprising the steps of:

a) applying a succession of test pulses over a succession of test periods to a line under test (LUT), each succeeding test pulse, after an initial test pulse, delayed in time from a beginning of a test period by a time that increases by a test time increment in each test period;

b) sampling a plurality of reflection signals from said LUT to obtain sampled reflection signal values, each said sampling occurring at a fixed time in a sample period and further occurring at n predetermined times during each sample period for each reflection signal, where n is an integer>1, successive ones of said plurality of reflection signals being sampled at different times during each sample period as a result of said test time increment added to each succeeding test pulse; and c) arranging sampled reflection signal values to represent a waveshape of said reflection signal.

10. The method as recited in claim 9 comprising, prior to step a, the added step of:

selecting a test pulse wave shape for said LUT.

11. The method as recited in claim 9 wherein step c arranges each sampled reflection signal in time order as though all sampled reflection signal values were obtained from a single reflection signal.

12. A time domain reflectometer for determining impulse characteristics of a line under test, said reflectometer comprising:

a test pulse signal source connected to the line under test to supply a plurality of test pulses to the line under test, each successive test pulse delayed in time from a preceding test pulse by a test period plus a time that increases by an increment of a test period, said increment increasing each test period; and means for sampling each reflected signal n times in each of a plurality of sample periods, wherein n is an integer>1, each sampling occurring at a same preset time in each sample period.

13. A time domain reflectometer according to claim 12, wherein said means for sampling comprises a reflection signal sampling circuit coupled to the line under test, said sampling circuit sampling reflection signals from the line under test in time coherency with a clock signal to obtain sampled reflection signal values.

14. A time domain reflectometer according to claim 13, further comprising an arranging circuit coupled to said sampling circuit, said arranging circuit positioning the sample reflection signal values, as though all sampled reflection signal values were obtained from a single reflection signal, to thereby represent a waveshape of a single reflection signal.

* * * * *